United States Patent
Chen et al.

(10) Patent No.: US 8,623,734 B2
(45) Date of Patent: Jan. 7, 2014

(54) METHOD TO SELECTIVELY GROW PHASE CHANGE MATERIAL INSIDE A VIA HOLE

(75) Inventors: Chieh-Fang Chen, Panchiao (TW); Chung H. Lam, Peekskill, NY (US); Alejandro G. Schrott, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 211 days.

(21) Appl. No.: 13/150,559

(22) Filed: Jun. 1, 2011

(65) Prior Publication Data

US 2012/0309159 A1 Dec. 6, 2012

(51) Int. Cl.
H01L 21/20 (2006.01)

(52) U.S. Cl.
USPC .................................. 438/381; 257/E45.002

(58) Field of Classification Search
USPC .................................. 438/381; 257/E45.002
See application file for complete search history.

(56) References Cited

U.S. PATENT DOCUMENTS

| | | | |
|---|---|---|---|
| 2007/0213499 A1 | 9/2007 | Uera et al. | |
| 2008/0118636 A1* | 5/2008 | Shin et al. | 427/124 |
| 2009/0215225 A1 | 8/2009 | Stender et al. | |
| 2009/0226603 A1* | 9/2009 | Lowrey | 427/58 |
| 2010/0291828 A1 | 11/2010 | Reches et al. | |
| 2011/0041910 A1 | 2/2011 | Shimomura et al. | |
| 2011/0117726 A1 | 5/2011 | Pinnington et al. | |

OTHER PUBLICATIONS

International Search Report and Written Opinion, PCT Application No. PCT/US2012/33708, p. 1-8 (Jul. 24, 2012).

* cited by examiner

*Primary Examiner* — Alexander Ghyka
*Assistant Examiner* — Stanetta Isaac
(74) *Attorney, Agent, or Firm* — Ido Tuchman; Vazken Alexanian

(57) ABSTRACT

An example embodiment is a method for filling a via hole with phase change material. The method steps include forming a bottom electrode in a substrate, depositing a dielectric layer above the bottom electrode, and forming a via hole within the dielectric layer down to a top surface of the bottom electrode. The substrate is heated to a reaction temperature and a first phase change material precursor is deposited within the via hole. The first precursor is configured to decompose on the top surface of the bottom electrode and chemisorb on a top surface of the dielectric layer at the reaction temperature. A second precursor is deposited within the via hole after the first precursor at least partially decomposes on the top surface of the bottom electrode.

19 Claims, 4 Drawing Sheets

METHOD TO SELECTIVELY GROW PHASE CHANGE MATERIAL INSIDE A VIA HOLE

BACKGROUND

The present invention is directed toward computer memory, and more particularly to a non-volatile phase change memory devices and methods for fabrication such devices.

There are two major groups in computer memory: non-volatile memory and volatile memory. Constant input of energy in order to retain information is not necessary in non-volatile memory but is required in the volatile memory. Examples of non-volatile memory devices are Read Only Memory, Flash Electrical Erasable Read Only Memory, Ferroelectric Random Access Memory, Magnetic Random Access Memory, and Phase Change Memory. Examples of volatile memory devices include Dynamic Random Access Memory (DRAM) and Static Random Access Memory (SRAM).

The present invention is directed to phase change memory (PCM). In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

Glass chalcogenides are a group of materials commonly utilized as phase change material. This group of materials contain a chalcogen (Periodic Table Group 16/VIA) and a more electropositive element. Selenium (Se) and tellurium (Te) are the two most common semiconductors in the group used to produce a glass chalcogenide when creating a phase change memory cell. An example of this would be $Ge_2Sb_2Te_5$ (GST), SbTe, and $In_2Se_3$. However, some phase change materials do not utilize chalcogen, such as GeSb. Thus, a variety of materials can be used in a phase change material cell as long as they can retain separate amorphous and crystalline states.

SUMMARY

One example of the invention is a method for filling a via hole with phase change material. The method includes forming a bottom electrode in a substrate, depositing a dielectric layer above the bottom electrode, and forming a via hole within the dielectric layer above the bottom electrode that extends down to a top surface of the bottom electrode. The substrate is heated to a reaction temperature and at least one first phase change material precursor is deposited within the via hole. The first precursor is configured to decompose on the top surface of the bottom electrode and chemisorb on a top surface of the dielectric layer at the reaction temperature. At least one second phase change material precursor is deposited within the via hole after the first precursor at least partially decomposes on the top surface of the bottom electrode.

DETAILED DESCRIPTION

Figure 1:
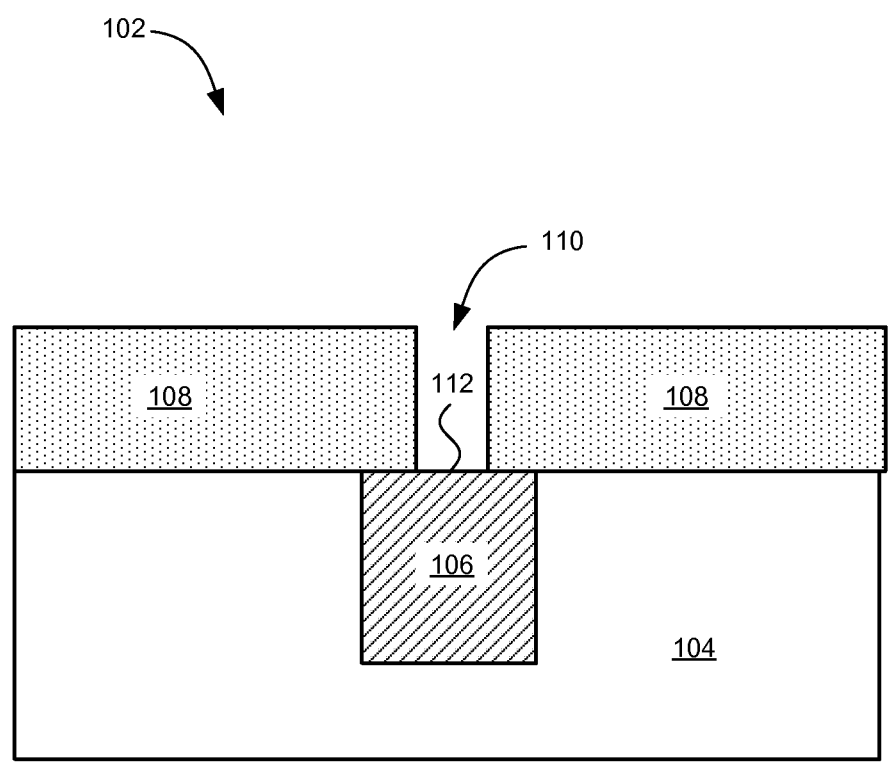
FIG. 1 shows an example structure of a fabricated phase change memory cell contemplated by the present invention.

The present invention is described with reference to embodiments of the invention. Throughout the description of the invention reference is made to FIGS. 1-4. When referring to the figures, like structures and elements shown throughout are indicated with like reference numerals.

FIG. 1 shows an example structure of a fabricated phase change memory cell 102 contemplated by the present invention. The memory cell 102 includes a substrate 104 and an electrically conductive bottom electrode 106 formed within the substrate 104.

A dielectric layer 108 is formed above the bottom electrode 106. The dielectric layer 108 may be composed of, for example, silicon oxide ($SiO_2$) or silicon nitride (SiN). Formation of the dielectric layer 108 may be achieved, for instance, by chemical vapor deposition (CVD).

The dielectric layer 108 includes a via hole 110 above the bottom electrode 106. As shown, the via hole 110 extends down to a top surface 112 of the bottom electrode 106. In one embodiment, the via hole 110 has a sub-lithographic critical dimension and a high aspect ratio. At a given temperature there is an equilibrium crystal size of the reacted mix, when deposited on a large cavity. By making the via smaller than the equilibrium size, the formation of a single crystal reacted product is promoted.

Figure 2:
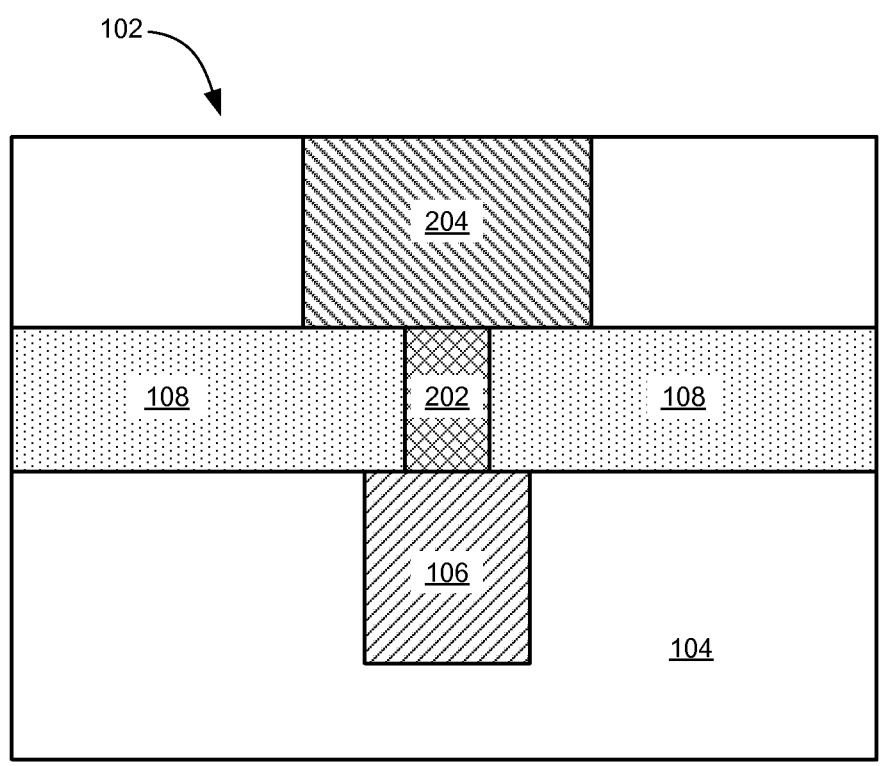
FIG. 2 shows a via hole filled with phase change material.

FIG. 2 shows the via hole 110 filled with phase change material 202. The phase change material 202 may include, for example, $Ge_2Sb_2Te_5$, SbTe or $In_2Se_3$. The phase change material 202 may be capped with a top electrode 204. By controlling the electric current passing between the top electrode 204 and the bottom electrode 106 and through the phase change material 202, the phase change material 202 can be programmed to different phase states by ohmic heating. As discussed below, an aspect of the present invention is a method of filling the via hole 110 with phase change material to achieve a more reliable electrical contact with the bottom electrode 106.

Although chemical vapor deposition and atomic layer deposition (ALD) methods may be used to deposit the phase change material in the via hole 110, these methods may produce polycrystalline phase change material with crystals larger than the size of the via hole. Thus, the phase change material may not properly fill the via hole. Further, amorphous phase change material may form voids and lose contact with the bottom electrode upon crystallization since the phase change material may shrink as it changes from the amorphous state to the crystalline state.

Figure 3:
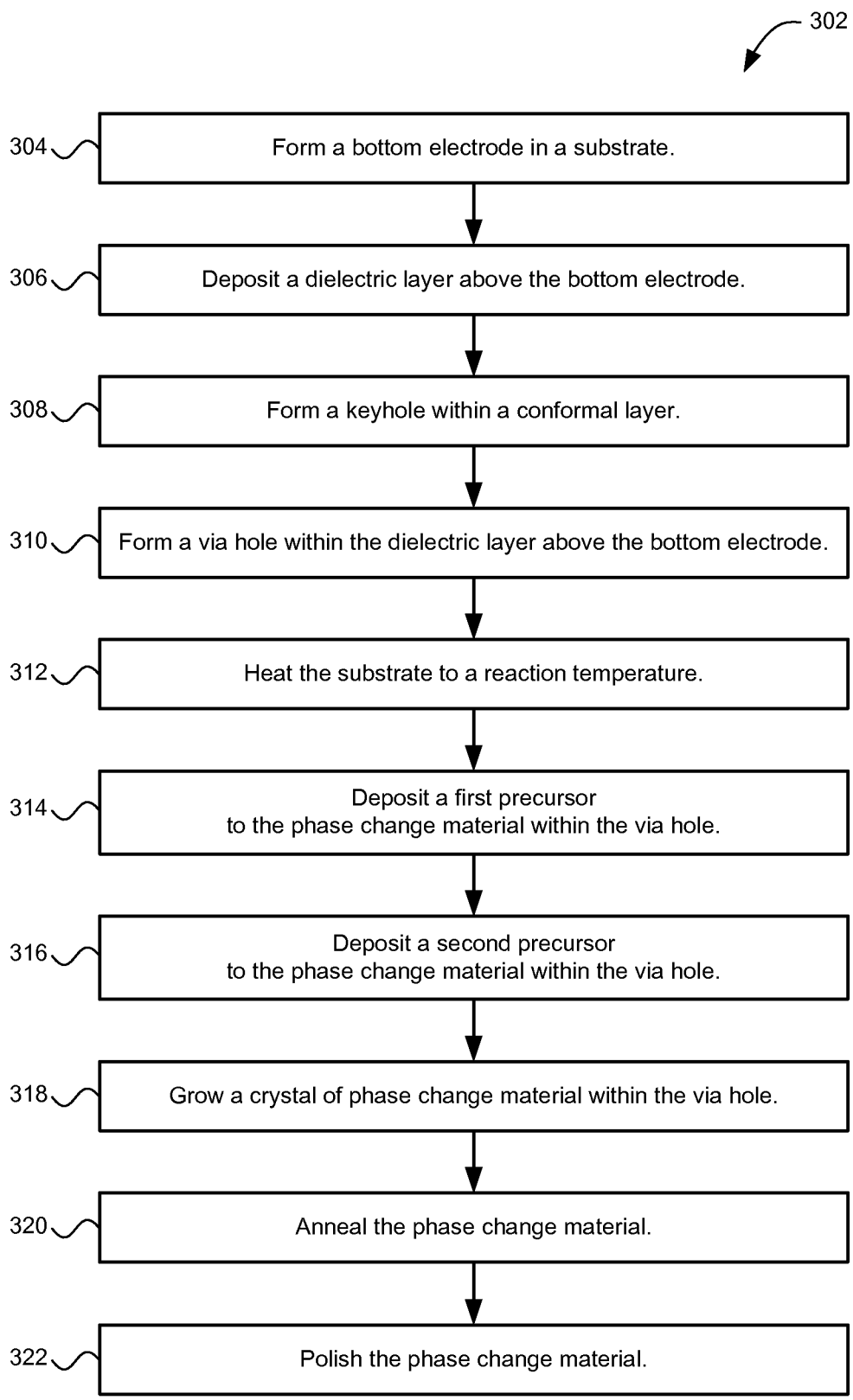
FIG. 3 shows a flowchart for a method of filling the via hole with the phase change material, as contemplated by one embodiment of the present invention.

FIG. 3 shows a flowchart 302 for a method of filling the via hole with the phase change material to achieve a more reliable electrical contact with the bottom electrode, as contemplated by one embodiment of the present invention. The method includes forming step 304. During this step, a bottom electrode is formed in a substrate. The bottom electrode may include a metallic material, such as tungsten (W) or titanium nitride (TiN). After forming step 304 is completed, the method proceeds to depositing step 306.

At depositing step 306, at least one dielectric layer is deposited above the bottom electrode. The dielectric layer may include, for example, silicon oxide ($SiO_2$) and/or silicon nitride (SiN). After depositing step 306 is completed, the method proceeds to forming steps 308 and 310.

At forming steps 308 and 310, a keyhole is formed within a conformal layer, and a via hole is formed within the dielectric layer above the bottom electrode. The diameter of the keyhole determines a diameter of the via hole. Furthermore, the via hole extends down to the top surface of the bottom electrode.

Figure 4:
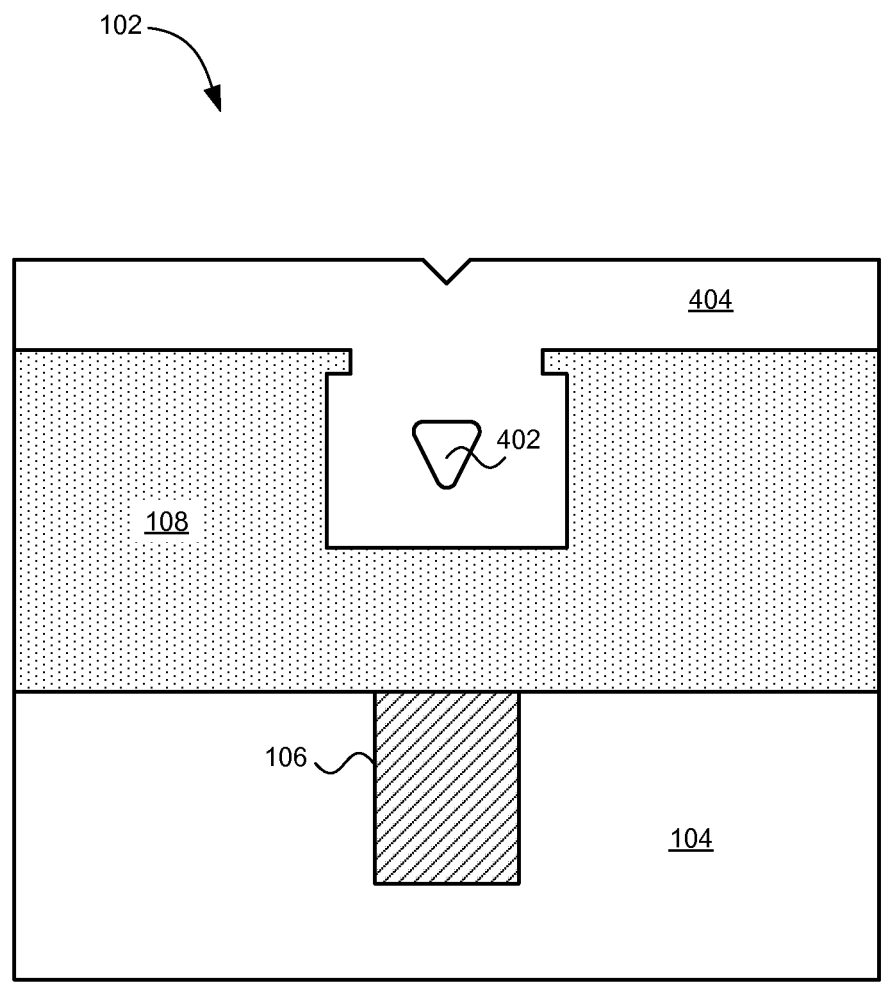
FIG. 4 shows a keyhole formed within a conformal layer.

Turning to FIG. 4, the keyhole 402 formed within the conformal layer 404 is shown. In one embodiment, forming the via hole in the dielectric layer includes reactive ion etching the dielectric layer through the keyhole. In doing so, a high aspect ratio, sub-lithographic critical dimension via hole can be formed within the insulating layer 108, as will be appreciated by those skilled in the art. After the via hole is formed, the conformal layer 404 is removed and the insulating layer 108 is polished down to the via hole.

Returning to FIG. 3, the substrate is heated to a reaction temperature at step 312. In one embodiment, the reaction temperature is between 100° C. and 350° C. At this temperature range desirable precursor selectivity, as discussed below, can occur. After heating step 312 is completed, the method proceeds to depositing step 314.

At depositing step 314, at least one first precursor to the phase change material is deposited within the via hole. This deposition may be carried out using, for example, chemical vapor deposition (CVD). The first precursor is configured to decompose on the top surface of the bottom electrode and chemisorb on a top surface of the dielectric layer at the reaction temperature. Additionally, the first precursor is configured to prevent a second precursor from decomposing on the surface of the dielectric layer at the reaction temperature. Moreover, the first precursor is configured to nucleate the phase change material over the bottom electrode in the presence of the second precursor at the reaction temperature.

In one embodiment, the first precursor may include an antimony (Sb) precursor, such as tris (dimethylamino) antimony and/or a tellurium (Te) precursor, such as di-tert-butyl-telluride. After depositing step 314 is completed, the method proceeds to depositing step 316.

At depositing step 314, at least one second precursor to the phase change material is deposited within the via hole. This step is performed after the first precursor has at least partially decomposed on the top surface of the bottom electrode. In one embodiment, the second precursor includes a germanium (Ge) precursor, such as tetrakis (dimethylamino) germane or di-tert-butyethylendiaminogermylene. Step 314 may consist of depositing the precursors in an alternate way or mixed in the desired proportions to attain the desired stoichiometry.

Next, at growing step 318, a crystal of phase change material is grown within the via hole after depositing the second precursor. Next, at annealing step 320, the phase change material is annealed to densify and improve its contact with the bottom electrode. At polishing step 322, the phase change material is polished to the top surface of the dielectric layer.

In view of the foregoing, the properties of the material that forms the bottom contact of via holes formed in dielectrics are used in order to perform a selective chemical vapor deposition (CVD) of phase change material alloys. The growth is achieved without using any reactive gas or plasma, and the decomposition selectivity of the precursors utilized allows for growing the material starting at the bottom contact, with no deposition on the dielectric top surface. This process helps ensure a uniform contact of the phase change material with the bottom electrode.

In one embodiment, the catalytic properties of metals versus typical dielectrics are exploited to generate a selective CVD or ALD deposition without forcing a reaction by the aid of a reactive gas or plasma. In one embodiment, the precursors described above are used in a manner that promotes phase change material growth only inside the via hole, with the reaction starting at the bottom metal electrode.

In general, both the precursors for Te and for Sb do not decompose on dielectrics like silicon oxide or silicon nitride, but do decompose on metal surfaces. On dielectrics, for decomposition and further growth, they need a germanium seed. The latter can be achieved on clean dielectric surfaces by using the germanium precursors described above, since the germanium precursors chosen react with both clean metal and dielectric surfaces. However, this type of deposition cannot achieve a proper filling of a small via hole, because the higher nucleation that occurs at the upper edges of the via hole precludes the precursors to reach at the bottom of the hole.

On the other hand, both the Sb and Te precursors chemisorb on the dielectric and prevent the decomposition of the Ge precursor. Following these properties the growth of phase change material restricted to the hole is achieved by first running Te or Sb or both precursors which will start growing only at the metal bottom of the via hole, and poison the dielectric for Ge chemisorption and decomposition.

This is followed by running all three or desired precursors to fill the hole with the desired composition. Since the grow may not be accurately controlled to finish forming a flush surface with the dielectric, a CMP process is performed, followed by a melt-anneal in order to densify and improve the contact with the bottom electrode, prior to continuing with the integration of the cell.

Having described embodiments for the invention (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for filling a via hole with phase change material, the method comprising:
    forming a bottom electrode in a substrate;
    depositing at least one dielectric layer above the bottom electrode;
    forming the via hole within the dielectric layer above the bottom electrode, the via hole extending down to a top surface of the bottom electrode;
    heating the substrate to a reaction temperature;
    depositing at least one first precursor to a phase change material within the via hole, the first precursor configured to decompose on the top surface of the bottom electrode and chemisorb on a top surface of the dielectric layer at the reaction temperature;
    depositing at least one second precursor to the phase change material within the via hole after the first precursor at least partially decomposes on the top surface of the bottom electrode, the first precursor is deposited before the second precursor; and
    wherein the first precursor is configured to prevent the second precursor from decomposing on the surface of the dielectric layer at the reaction temperature.

2. The method of claim 1, wherein the bottom electrode includes a metallic material.

3. The method of claim 1, wherein the reaction temperature is between 100° C. and 350° C.

4. The method of claim 1, wherein the first precursor is configured to nucleate the phase change material over the bottom electrode in the presence of the second precursor at the reaction temperature.

5. The method of claim 1, wherein the first precursor includes an antimony (Sb) precursor.

6. The method of claim 1, wherein the first precursor includes a tellurium (Te) precursor.

7. The method of claim 1, wherein the second precursor includes a germanium (Ge) precursor.

8. The method of claim 1, further comprising polishing the phase change material to the top surface of the dielectric layer after depositing the second precursors, either sequentially or mixed in a desired proportion.

9. The method of claim 1, further comprising annealing the phase change material after depositing the second precursor.

10. The method of claim 1, further comprising growing a crystal of phase change material within the via hole after depositing the second precursor.

11. The method of claim 1, wherein the dielectric layer includes silicon oxide ($SiO_2$).

12. The method of claim 1, wherein the dielectric layer includes silicon nitride (SiN).

13. The method of claim 1, wherein the bottom electrode includes tungsten (W).

14. The method of claim 1, wherein the bottom electrode includes titanium nitride (TiN).

15. The method of claim 1, further comprising:
forming a keyhole within a conformal layer; and
wherein forming the via hole in the dielectric layer comprises reactive ion etching the dielectric layer through the keyhole.

16. The method of claim 15, wherein a diameter of the keyhole determines a diameter of the via hole.

17. The method of claim 1, wherein the first precursor includes at least one of tris (dimethylamino) antimony and di-tert-butyltelluride.

18. The method of claim 1, wherein the second precursor includes tetrakis (dimethylamino) germane.

19. The method of claim 1, wherein the second precursor includes di-tert-butyethylendiaminogermylene.

* * * * *